United States Patent
Kishi et al.

(10) Patent No.: US 10,464,153 B2
(45) Date of Patent: Nov. 5, 2019

(54) CONNECTING METHOD OF CIRCUIT MEMBER

(71) Applicant: Panasonic Intellectual Property Management Co., Ltd., Osaka (JP)

(72) Inventors: Arata Kishi, Fukuoka (JP); Hiroki Maruo, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 96 days.

(21) Appl. No.: 15/582,794

(22) Filed: May 1, 2017

(65) Prior Publication Data
US 2017/0326663 A1 Nov. 16, 2017

(30) Foreign Application Priority Data
May 12, 2016 (JP) ................................. 2016-096269

(51) Int. Cl.
*B23K 35/26* (2006.01)
*H01L 23/00* (2006.01)
(Continued)

(52) U.S. Cl.
CPC .......... *B23K 1/0016* (2013.01); *B23K 35/26* (2013.01); *B23K 35/264* (2013.01); *C22C 12/00* (2013.01); *H01L 24/81* (2013.01); *H01L 24/83* (2013.01); *H01L 24/92* (2013.01); *B23K 2101/36* (2018.08); *B23K 2103/08* (2018.08); *H01L 2224/13144* (2013.01); *H01L 2224/16227* (2013.01); *H01L 2224/16501* (2013.01); *H01L 2224/2919* (2013.01);
(Continued)

(58) Field of Classification Search
None
See application file for complete search history.

(56) References Cited

U.S. PATENT DOCUMENTS 8,343,383 B2 * 1/2013 Ueshima ............... C22C 1/0483
252/512
2003/0189260 A1 * 10/2003 Tong ....................... H01L 24/10
257/778
(Continued)

FOREIGN PATENT DOCUMENTS

JP 8-186156 A 7/1996
JP H10-321633 A 12/1998
(Continued)

*Primary Examiner* — Devang R Patel
(74) *Attorney, Agent, or Firm* — Pearne & Gordon LLP (57) ABSTRACT

A connecting method of a circuit member, includes: a first process of preparing a connection material that a solder material disperses in the adhesive; a second process of disposing the first circuit member and the second circuit member to cause the first electrode of the first circuit member and the second electrode of the second circuit member to oppose each other via the connection material; and a third process of compressing the first circuit member and the second circuit member while applying heat to the connection material. The third process includes a first pressing process which is performed before a temperature of the connection material reaches a melting point of the solder material, and a second pressing process which follows the first pressing process.

8 Claims, 4 Drawing Sheets

(51) Int. Cl.
  *B23K 1/00* (2006.01)
  *C22C 12/00* (2006.01)
  *B23K 101/36* (2006.01)
  *B23K 103/08* (2006.01)

(52) U.S. Cl.
  CPC ............... *H01L 2224/32225* (2013.01); *H01L 2224/81191* (2013.01); *H01L 2224/81203* (2013.01); *H01L 2224/81801* (2013.01); *H01L 2224/8385* (2013.01); *H01L 2224/83203* (2013.01); *H01L 2224/9211* (2013.01); *H01L 2924/014* (2013.01); *H01L 2924/01049* (2013.01); *H01L 2924/01083* (2013.01); *H01L 2924/0665* (2013.01)

(56) References Cited

U.S. PATENT DOCUMENTS

| | | | |
|---|---|---|---|
| 2004/0211060 A1 | 10/2004 | Suga et al. | |
| 2010/0059872 A1* | 3/2010 | Katsurayama | C09J 9/02 257/686 |
| 2010/0195292 A1* | 8/2010 | Ide | H01L 23/3142 361/748 |
| 2012/0061820 A1* | 3/2012 | Maejima | H01L 21/563 257/734 |
| 2012/0085580 A1* | 4/2012 | Yamamoto | C09J 9/02 174/84 R |
| 2012/0231689 A1* | 9/2012 | Kim | C09J 133/08 442/181 |
| 2012/0255766 A1* | 10/2012 | Igarashi | H01L 24/29 174/257 |
| 2015/0208509 A1* | 7/2015 | Sakai | H05K 3/323 361/751 |
| 2016/0316554 A1* | 10/2016 | Kishi | H05K 1/0274 |

FOREIGN PATENT DOCUMENTS

| | | |
|---|---|---|
| JP | 2001-198692 A | 7/2001 |
| JP | 2004-327718 A | 11/2004 |
| JP | 2010-226140 A | 10/2010 |

* cited by examiner

PRIOR ART

CONNECTING METHOD OF CIRCUIT MEMBER

BACKGROUND

1. Technical Field

The disclosure relates to & method for connecting electrodes of a first circuit member and a second circuit member of which each has an electrode with each other, by using a connection material containing a solder material.

2. Description of the Related Art

In connecting a first circuit, member having a first electrode and a second circuit member having a second electrode with each other, an anisotropic conductive adhesive containing a conductive particle is widely used. The first circuit member and the second circuit member adhere to each other by the anisotropic conductive adhesive, and the first electrode and the second electrode are electrically connected to each other by the conductive particle.

As the conductive particle of the anisotropic conductive adhesive, for example, a gold-plated nickel particle or a metal-plated resin particle is used. The nickel particle or the resin particle achieves electric connection with the electrode by coining into contact with the electrode in a state of being compressed between the electrodes. In order to achieve the electric connection by bringing the electrode and the conductive particle into contact with each other, a high pressure (for example, 50 MPa to 150 MPa) is necessary.

In addition, the connection between the circuit members by the anisotropic conductive adhesive is performed by thermocompression bonding, for example, under the temperature of approximately 200° C. Therefore, when a high pressure is applied to the anisotropic conductive adhesive interposed between the first circuit member and the second circuit member, viscosity of the adhesive largely deteriorates, and fluidity increases. Therefore, the conductive particle is likely to be pushed out to the periphery thereof from a part between the electrodes together with the adhesive, and is unlikely to efficiently capture the conductive particle between the electrodes. In addition, since the pressure applied to each of the circuit members is high and the thermal stress applied to the circuit member is also high, in a case where the circuit member is thin and the strength thereof is low, a defect, such as a curve of the circuit member, is likely to be generated.

Here, achievement of the electric connection by wetting between the electrode and a molten solder by using a solder particle instead, of the conductive particle, is investigated. For example, Japanese Patent Unexamined Publication No. H08-186156 suggests to heat a thermosetting adhesive containing the solder particle in two steps during the thermocompression bonding. Specifically, the thermosetting adhesive is temporarily heated to a temperature at which the solder particle is not melted, the adhesive is hardened to a certain extent, and then, the adhesive is mainly heated at a temperature at which the solder particle is melted, and the adhesive is completely hardened. Accordingly, an excessive flow of the molten solder is suppressed.

Figure 3:
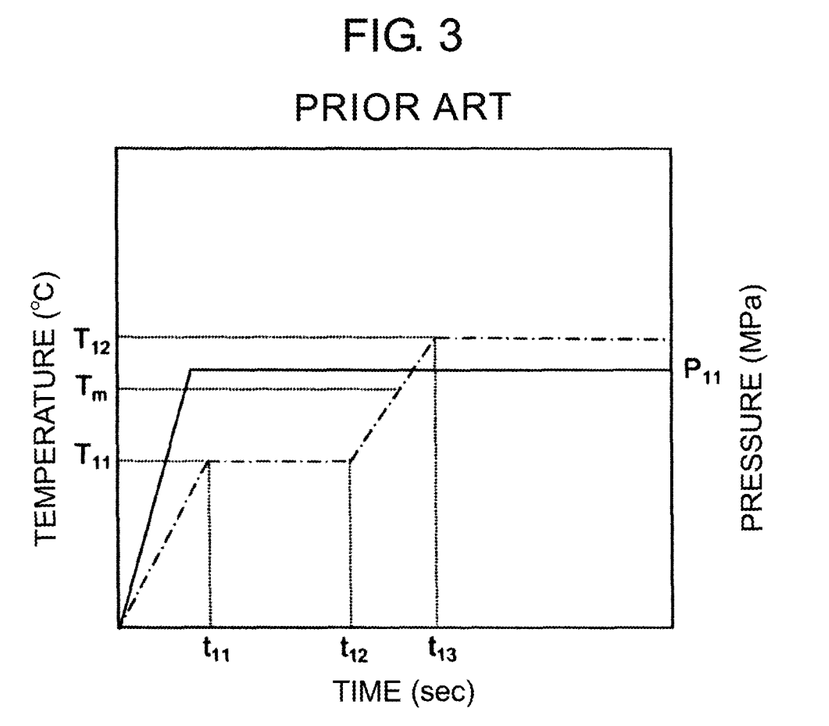
FIG. 3 is a schematic view illustrating an example of a temperature profile of a connection material and a pressure profile applied to a solder material in a thermocompression bonding process of a connecting method of a circuit member of the related art.

In FIG. 3, an example of a temperature profile of the adhesive in a thermocompression bonding process and a pressure profile applied to the solder particle is illustrated. In FIG. 3, a solid line illustrates the pressure profile, and a one-dot chain line illustrates the temperature profile. In an initial stage (from time $t_{11}$ to $t_{12}$) of the thermocompression bonding, the adhesive containing the solder particle is heated at a temperature $T_{11}$ lower than a melting point Tm of the solder material, and a pressure of $P_{11}$ is applied to the solder particle. After this, a heating temperature is increased, and after a time $t_{13}$, main heating is performed at a temperature $T_{12}$ that exceeds the melting point Tm. In the main heating, when the solder particle is melted and wet-spreads to the electrode and the heating is finished, the solder is solidified and the electric connection is achieved.

SUMMARY

The disclosure is directed to a connecting method of a circuit member, including a first process of preparing a connection material containing an adhesive and a solder material that disperses in the adhesive; a second process of preparing a first circuit member having a first electrode and a second circuit member having a second electrode, and disposing the first circuit member and the second circuit member to allow the first electrode and the second electrode to oppose each other via the connection material; and a third process of compressing the first circuit member and the second circuit member while applying heat to the connection material, are provided, the third process includes a first pressing process which is performed before a temperature of the connection material reaches a melting point of the solder material, and a second pressing process which follows the first pressing process, in the first pressing process, after the solder material is pressed at a first pressure and is deformed, a pressure for pressing the solder material is changed to a second pressure that is lower than the first pressure, and in the second pressing process, the solder material is pressed at the second pressure.

According to the connecting method of a circuit member according to the disclosure, it is possible to improve reliability of electric connection between the first electrode of the first circuit member and the second electrode of the second circuit member.

DETAILED DESCRIPTION

Before the description of the embodiment, a problem in the technology of the related art will be briefly described.

From the viewpoint of efficiently connecting circuit members with each other, it is desirable that thermocompression bonding is performed during a short period of time. In this case, when performing the thermocompression bonding, it is extremely difficult to perform a control of a heating temperature in two steps as illustrated in FIG. 3. In addition, in order to allow hardening of a thermosetting adhesive to proceed to a certain extent by a temporary heating, it is necessary to elongate a period of time (a period of rime from $t_{11}$ to $t_{12}$ in FIG. 3) of the temporary heating to a certain extent.

In other words, the thermocompression bonding requires a relatively long period of time, and it is disadvantageous in a case of using a thin circuit member having a weak strength. Furthermore, when the hardening of the thermosetting adhesive proceeds, fluidity of the adhesive increases, and thus, similar to a case of a nickel particle or a resin particle, the solder particle is likely to be pushed out from a part between electrodes to a periphery thereof.

Figure 4:
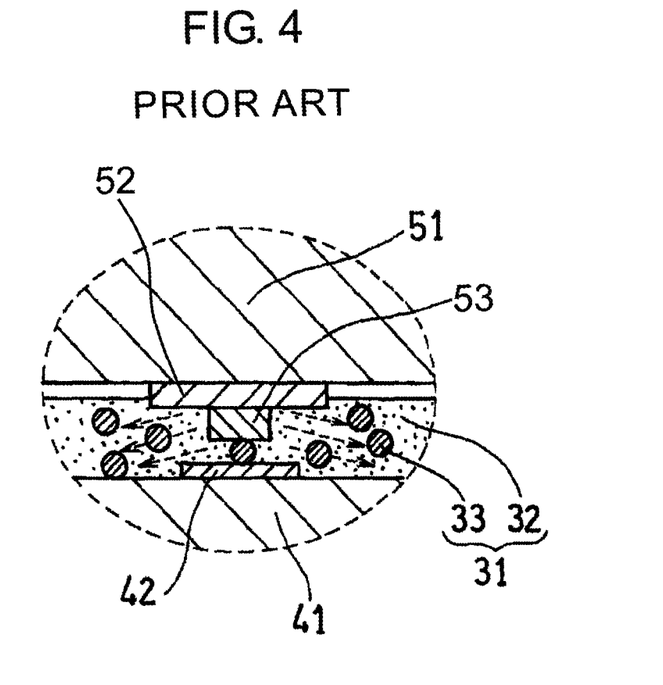
FIG. 4 is a schematic view of main portions illustrating an example of a state of the connection material in the thermocompression bonding process of the related art.

FIG. 4 schematically illustrates a flow state of connection material 31 (a mixture of adhesive 32 and solder particle 33) when pressing second circuit member 51 to first circuit member 41. Connection material 31 contains adhesive 32 and solder particle 33 that disperses in adhesive 32. When a viscosity of adhesive 32 decreases, and when a pressure is applied between first electrode 42 and bump 53 provided in second electrode 52, in accordance with a flow of adhesive 32, a probability that solder particle 33 is pushed out from a part between the electrodes increase. When the movement of solder particle 33 becomes significant, a possibility of generation of a short circuit between adjacent electrodes increases. In recent years, as the size of a liquid crystal display decreases, the size of electrode decreases, and a pitch between the adjacent electrodes also becomes narrow. Therefore, when a necessary amount of solder particle 33 is ensured between first electrode 42 and second electrode 52, it becomes difficult to suppress a short circuit between the adjacent electrodes.

The disclosure relates to a connecting method of a circuit member including a first process of preparing a connection material containing an adhesive and a solder material that disperses in the adhesive; a second process of preparing a first circuit member having a first electrode and a second circuit member having a second electrode, and disposing the first circuit member and the second circuit member to allow the first electrode and the second electrode to oppose each other via the connection material; and a third process (thermocompression bonding process) of compressing the first circuit member and the second circuit member while applying heat to the connection material.

The connecting method of a circuit member according to the disclosure is an excellent method for electrically connecting the first electrode and the second electrode with each other by using a solder material in the third process. Specifically, before a temperature of the connection material reaches a melting point of the solder material, after the solder material is pressed at a first pressure and is deformed, the pressure for pressing the solder material changes to a second pressure that is lower than the first pressure (first pressing process). After this, the solder material is pressed at the second pressure following the first pressing process (second pressing process). In the second pressing process, as the connection material is heated to a temperature that is equal to or higher than the melting point of the solder material, the solder material is melted.

In the first pressing process, in order to press the solder material before the melting by the first electrode and the second electrode and nip the solder material between both of the electrodes, the solder material is firmly captured by the first electrode and the second electrode by an anchor effect. Since the solder material is essentially soft, it is possible to easily capture the solder material between the electrodes by the first pressure that is lower than that in a case of the related art where an anisotropic conductive adhesive containing a resin particle or the Like is used.

In addition, in the first pressing process, before the viscosity of the adhesive largely deteriorates by heating and the adhesive starts to flow, the first pressure which is lower than that of the related art is applied. Therefore, a case where the solder material is pushed out from a part between the electrodes to the periphery thereof in accordance with the flow of the adhesive is avoided. In addition, since the solder material is firmly captured between the electrodes in the first pressing process, in the second pressing process, even when the adhesive starts to flow by the heating, a case where the solder material is pushed out from the part between the electrodes to the periphery thereof in accordance with the flow of the adhesive is suppressed.

Furthermore, in the first pressing process, before the solder material is melted, the pressure applied to the solder material is decreased to the second pressure from the first pressure. Accordingly, in the second pressing process, the melted solder material is not excessively crushed, and the generation of a short circuit between the adjacent electrodes is suppressed.

In the second pressing process, as the melted solder material wet-spreads between the electrodes, it is possible to achieve the electric connection between the electrodes, and thus, a high pressure in a case where the anisotropic conductive adhesive containing a resin particle or the like is used is unnecessary. Accordingly, the second pressure can be set to be extremely low, and in a case of connecting a thin circuit member having low strength, it is also possible to suppress generation of a defect, such as a curve of the circuit member.

As described above, by employing the first pressing process and the second pressing process, it is possible to improve reliability of the electric connection between the first electrode and the second electrode. The connecting method is particularly advantageous in a case of connecting a thin circuit member having a low strength, or in a case of connecting a circuit member having a narrow pitch between the adjacent electrodes.

Hereinafter, the connecting method of a circuit member according to the disclosure will be specifically described.

First Process

In the process, the connection material containing the adhesive and the solder material that disperses in the adhesive is prepared. The connection material may have a shape of paste or a shape of a film.

Adhesive

The adhesive is a resin composition containing a thermosetting resin and/or a thermoplastic resin. Among these, the resin composition containing a thermosetting resin is preferable, and the thermosetting resin preferably contains an epoxy resin. The resin composition may contain a hardener of the thermosetting resin. Examples of the hardener include amine, phenol resin, and acid anhydride. The resin composition may further contain various additives. Examples of the additive include an activator that removes acid anhydride of the solder material or a surface of the electrode, a filler, and a hardening accelerator.

The temperature at which the hardening reaction of the thermosetting resin proceeds is preferably higher than the melting point of the solder material. Accordingly, most of the hardening reaction of the thermosetting resin or the like proceeds after the solder material is melted and the first electrode and the second electrode are wet by the solder material. Accordingly, it is possible to improve reliability of the electric connection between the first electrode and the second electrode. In addition, the thermosetting resin of which the temperature at which the hardening reaction proceeds is high is unlikely to be melted in the first pressing process, and is likely to maintain the fluidity to be low. The temperature at which the hardening reaction proceeds is acquired, for example, by an endothermic peak temperature measured by a differential scanning calorimetry (DSC).

In order to efficiently capture the solder material between the electrodes, the adhesive is preferably in a solidified state at a room temperature. In addition, in the first pressing process, at a time point when the maximum pressure (first pressure) is applied to the solder material, it is preferable that the adhesive rarely flow or the fluidity is low, and it is the most preferable that the adhesive maintains the solidified state. Accordingly, a case where the solder material is pushed out from the part between the electrodes by the flow of the adhesive is suppressed.

Solder Material

The solder material is not particularly limited, and contains, for example, tin, silver, bismuth, indium, nickel, zinc, or copper, and as an alloy containing these elements, a tin-silver-copper alloy, a tin-bismuth alloy, a tin-indium alloy, a tin-zinc alloy, a bismuth-indium alloy, or a tin-bismuth-indium alloy can be used as the solder material. Among these, the solder material preferably contains the bismuth-indium alloy. The solder material containing bismuth and indium is relatively soft, and for example, the Vickers hardness is less than 20 Hv, and thus, the anchor effect between the electrodes is easily obtained when pressing the solder material in the first pressing process.

In addition, since the indium contained in the solder material is excellent in malleability, it is possible to increase a wetted area of the solder material and the first electrode and the second electrode. Meanwhile, the bismuth is abnormal liquid of which a volume expands when being solidified from the melted state. As the solder material contains bismuth, when the solder material is solidified, the pressure is increased on an interface between the solder material and the first electrode and the second electrode. Accordingly, a solder portion formed by solidifying the solder material can firmly adhere to the first electrode and the second electrode. In other words, in a case where the second pressure applied to the solder material is extremely low, as the solder material contains bismuth and indium, high reliability of the electric connection between the first electrode and the second electrode can also be obtained.

The melting point of the alloy containing bismuth and indium can become low. Therefore, a heating temperature that is necessary for the connection between the electrodes may also be a low temperature (for example, equal to or lower than a melting point of the solder material +10° C.). Accordingly, when connecting the electrodes with each other, it is possible to decrease a pressure applied to the circuit member and a stress caused by heat. Accordingly, in a case of connecting a thin circuit member having a low strength, a defect is unlikely to be generated, and it is also possible to ensure high reliability.

The bismuth-indium alloy contained in the solder material has, for example, a shape of a particle. The size of the particle of the bismuth-indium alloy (hereinafter, alloy particle) is selected from the viewpoint of ensuring conduction between the first electrode and the second electrode and ensuring insulation between the adjacent electrodes. As an example, it is desirable that the size (maximum diameter) of the alloy particle is equal to or less than 1/5 of an electrode width, and it is more desirable to be equal to or less than 1/10.

In addition, the solder material may contain components in addition to the bismuth-indium alloy, but 95% by mass or more is preferably the bismuth-indium alloy, and 98% by mass or more is more preferably the bismuth-indium alloy.

The melting point (mp) of the bismuth-indium alloy contained in the solder material is preferably from 72° C. to 109° C., is more preferably from 85° C. to 109° C., and is particularly preferably from 88° C. to 90° C. Accordingly, the connection between the electrodes can be performed at a low temperature that is, for example, equal to or lower than 110° C., and is preferably equal to lower than 100° C. Accordingly, it is possible to substantially reduce the stress caused by heat that remains in the circuit member.

Examples of the bismuth-indium alloy of which the melting point is 72° C. to 109° C. include 35Bi-65In (mp: 72° C. 51Bi-49In (mp: 85° C.), 55Bi-45In (mp: 89° C), 27Bi-73In (mp: 100° C.), and 68Bi-32In (mp: 109° C.). However, XBi-YIn means an alloy containing X % by mass of bismuth and Y % by mass of indium.

In the bismuth-indium alloy contained in the solder material, the amount of bismuth contained in the bismuth-indium alloy is preferably from 27% by mass to 68% by mass, and is more preferably from 51% by mass to 55% by mass. Most (99% by mass or more of a remaining part) of the remaining part of the bismuth-indium alloy is preferably indium. The bismuth-indium alloy has high wettability and connection reliability between the electrodes, and a low melting point. Examples of the bismuth-indium alloy also include at least one type selected from a group made of $BiIn_2$, $Bi_3In_5$, and BiIn.

In addition, from the viewpoint of improving reliability of electric connection, in the bismuth-indium alloy contained in the solder material, the amount of indium contained in the bismuth-indium alloy is preferably from 32% by mass to 73% by mass, is more preferably from 32% by mass to 49% by mass, and is particularly preferable from 43% by mass to 47% by mass.

In the connection material containing the adhesive and the solder material, the amount of the solder material may be, for example, from 5% by mass to 80% by mass. By setting the amount of the solder material to be in the above-described range, it becomes easy to reliably ensure both high connection reliability between the first electrode and the second electrode and insulation between the adjacent electrode.

Second Process

The process includes a second process a of preparing the first circuit member having the first electrode and the second circuit member having the second electrode, and a second process b of disposing the first circuit member and the second circuit member such that the first electrode and the second electrode oppose each other via the connection material.

Second Process A

For example, the first circuit member having a first main surface provided with the plurality of first electrodes that are arranged at a predetermined pitch, and a second circuit member having a second main surface provided with the plurality of second electrodes that are arranged at a predetermined pitch, are prepared.

First Circuit Member

The first circuit member is not particularly limited but for example, may be a transparent board used in a display panel provided in a television, a tablet, a smartphone, and a wearable device. The transparent board may be semitransparent. Examples of the transparent board include a glass board and a film-like board. The film-like board is formed of a transparent resin film. The transparent resin film may be a film, such as polyethylene terephthalate (PET), polycarbonate (PC), or polyethylene naphthalate (PEN).

In a case where the first circuit member is a transparent board, a transparent electrode is used as the first electrode. The transparent electrode may be an oxide containing indium and tin, and may contain a fine amount of third metal element in addition to indium and tin. A representative example of the transparent electrode is a so-called indium tin oxide or indium tin oxide (ITO) electrode.

Second Circuit Member

The second circuit member is not particularly limited, but for example, may be a semiconductor chip, an electronic component package, a film board, and a connector.

The second electrode is not particularly limited, but for example, may be a metal electrode containing gold, platinum, copper, nickel, palladium, or various solders. The solder which forms the metal electrode may include, for example, tin, silver, bismuth, indium, nickel, or copper.

Bump

A bump may be provided in at least one of the first electrode and the second electrode. At this time, the Vickers hardness of the bump is preferably greater than the Vickers hardness of the solder material. Accordingly, in the first pressing process, it is possible to easily capture the panicle of solder material before being melted between the bump and the electrode or between the bumps, and the anchor effect is also easily obtained. The Vickers hardness is acquired by a measuring method based on JIS Z 2244.

If is preferable that the Vickers hardness of the bump is equal to or greater than 20 Hv and the Vickers hardness of the solder material is less than 20 Hv. More preferably, the Vickers hardness of the bump is equal to or greater than 22 Hv and the Vickers hardness of the solder material is less than 18 Hv.

The bump preferably contains gold at least in the surface. Accordingly, it is possible to easily obtain a bump of which the Vickers hardness is equal to or greater than 20 Hv. In addition, a bump containing copper having a coating layer in which the solder is contained in the surface is also preferable. As the solder contained in the coating layer, a tin-silver-copper alloy is preferable.

Second Process B

In the process, the first circuit member and the second circuit member are disposed such that the first electrode and the second electrode oppose each other via the connection material.

For example, in a case where the first circuit member having the first main surface provided with the plurality of first electrodes that are arranged at a predetermined pitch, and the second circuit member having the second main surface provided with the plurality of second electrodes that are arranged at a predetermined pitch, are used, in a region (hereinafter, first connection region) which covers at least a part of the first electrode of the first main surface of the first circuit member, the connection material is disposed. When the connection material has a shape of paste containing the thermosetting resin in an unhardened state or in a semi-hardened state or an unhardened light curing resin, the first connection region may be coated with the connection material by using a printing device, a dispenser, or an ink jet nozzle. When the connection material has a shape of a film or a shape of a tape, the film cut out in a predetermined shape from the board may be peeled, and may be compressed to the first connection region. The operation is performed, for example, by a known tape attaching device. In addition, in a region (second connection region) which covers at least a part of the second electrode of the second main surface of the second circuit member, the connection material may be disposed, and may be disposed in both of the first and second connection regions. Accordingly, a laminated structure in which the first circuit member and the second circuit member are disposed to oppose each other is obtained.

Third Process

In the process, the first circuit member and the second circuit member are compressed while applying heat to the connection material. In the third process, for example, by using a tool for pressing, the second circuit member may be pressed to the first circuit member, and the first circuit member may be pressed to the second circuit member. The heating of the connection material is performed by heating the first circuit member and/or the second circuit member, for example, by using a tool for heating. The tool for pressing may also be used as a tool for heating.

The third process includes a process (first pressing process) of pressing the solder material at the first pressure, and a process (second pressing process) of pressing the solder material at the second pressure following the first pressing process.

First Pressing Process

In the first pressing process, before the temperature of the connection material reaches the melting point of the solder material, and after the solder material is pressed at the first pressure and is deformed, the pressure for pressing the solder material changes to the second pressure that is lower than the first pressure.

Before the pressure changes to the second pressure, the pressure for pressing the solder material before being melted may be constant after reaching a predetermined pressure, and may vary within a predetermined range. However, in a case where the pressure for pressing the solder material before being melted varies, the first pressure indicates the maximum pressure in the first pressing process. The first pressure may be a pressure at which the solder material before being melted is not excessively crushed and is captured in a state of being deformed to a certain extent, between the electrodes.

A case where the pressure is changed from the first pressure to the second pressure means a case where the pressure for pressing the solder material before being melted is lowered to the pressure at which the melted solder material is not excessively crushed and appropriately wet-spreads, between the electrodes, from the first pressure (maximum pressure).

The first pressing process is performed before the viscosity of the adhesive deteriorates by the heating and the adhesive starts to flow from the part between the first electrode and the second electrode to the periphery thereof. Therefore, a case where the solder material is pushed out from the part between the first electrode and the second electrode to the periphery thereof in accordance with the flow of the adhesive, is suppressed. Accordingly, in a case where the connection area between the first electrode and the second electrode is small, it is also possible to efficiently capture a sufficient amount of solder material between the first electrode and the second electrode.

In the first pressing process, a state where the viscosity before the adhesive starts to flow is high, is achieved. Therefore, in order to capture the solder material before being melted between the electrodes, the adhesive having high viscosity is pressed at the first pressure that is higher than the second pressure. At this time, since the solder material is not melted, even when pressing the solder material at the first pressure that is higher than the second pressure, the solder material is not excessively crushed, and it is possible to capture the solder material in a state of being deformed to a certain extent.

The first pressure may be lower than that in a case of using the anisotropic conductive adhesive containing the resin particle or the like. Since the electric connection between the electrode and the solder material is not achieved by a contact, and is achieved as the melted solder material wet-spreads to the electrode, the high pressure is not necessary. Since the first pressure is low, in a case of connecting the thin circuit member having a low strength, a defect, such as a curve of the circuit member, is unlikely to be generated, and it is also possible to ensure high reliability of the connection of the circuit member.

The first pressure is preferable from 15 MPa to 30 MPa, and more preferably from 15 MPa to 20 MPa. When the first pressure is equal to or higher than 15 MPa, it is possible to more reliably improve a capture ratio of the solder material (in particular, the bismuth-indium alloy). When the first pressure is equal to or lower than 30 MPa, the solder material (in particular, the bismuth-indium alloy) is not excessively crushed, and can also be easily captured in a state of being deformed to a certain extent. In addition, in a case where the circuit member is thin and the strength thereof is low, it is also possible to more reliably suppress generation of a defect, such as a curve of the circuit member.

Since the solder material containing the bismuth-indium alloy is relatively soft, even when the first pressure is a low pressure that is equal to or lower than 20 MPa, it is possible to easily and reliably capture the solder material before being melted in a state of being appropriately deformed. When the first pressure is equal to or lower than 20 MPa, generation of a defect, such as a curve of the circuit member, is substantially suppressed.

Since the first pressing process is performed before the viscosity of the adhesive deteriorates due to the heating and the adhesive starts to flow, compared to the second pressing process, the first pressing process is performed during an extremely short period of time. Accordingly, the first pressing process is finished in a state where most of the connection material is not heated or immediately after the connection material is heated. Therefore, in the first pressing process, a thermal stress caused by heating the circuit member is rarely applied.

Since the period of time during which the first pressure is applied is extremely short, in a case where the circuit member is thin and the strength thereof is low, it is also possible to suppress generation of a defect, such as a curve of the circuit member.

The period of time during which the first pressure is applied is preferably equal to or less than 5 seconds. When the period of time during which the first pressure is applied is equal to or less than 5 seconds, in a case where the circuit member is thin and the strength thereof is low, it is possible to more reliably suppress generation of a defect, such as a curve of the circuit member. The period of time during which the first pressure is applied is more preferably equal to or less than 1 second.

Second Pressing Process

In the second pressing process, while pressing the solder material at the second pressure, by heating the adhesive material to a temperature that is equal to or higher than the melting point of the solder material, the solder material is melted. Accordingly, the melted solder material can wet-spread between the electrodes. In the first pressing process, since a sufficient amount of solder materials is ensured between the electrodes, in a case where the connection area between the electrodes is small, the solder material can also sufficiently wet-spread between the electrodes.

When the second pressure is a pressure at which the melted solder material is not excessively crushed and can appropriately wet-spread, between the electrodes, the second pressure may be constant after reaching the predetermined pressure, and may be deformed within the predetermined range.

Since the second pressure applied to the circuit member is extremely low, in a case where the circuit member is thin and the strength thereof is low, it is also possible to suppress generation of a defect, such as a curve of the circuit member. In addition, in a case where the melted solder material is pressed at a pressure that is lower than the first pressure, a detect, such as a short circuit between the adjacent electrodes, is also suppressed.

In the second pressing process, by the heating, the viscosity of the adhesive preferably deteriorates to the extent that the adhesive can flow. Accordingly, it is possible to set the second pressure to be lower.

The second pressure is preferably equal to or lower than 40% of the first pressure. When the second pressure is equal to or lower than 40% of the first pressure, it is possible to snore reliably suppress generation of a defect caused by the excessively crushed melted solder material. In addition, generation of a defect, such as a curve of the circuit member, can also be more reliably suppressed. The second pressure is more preferably equal to or lower than 25% of the first pressure.

The second pressure is more preferably equal to or higher than 3% of the first pressure. When the second pressure is equal to or higher than 3% of the first pressure, wet-spreading of the melted solder material is accelerated between the first electrode and the second electrode. The second pressure is more preferably equal to or higher than 6% of the first pressure, and is further more preferably equal to higher than 10%.

The second pressure is preferably from 0.5 MPa to 10 MPa, is more preferably from 0.5 MPa to 4 MPa, and is particularly preferable approximately from 1 MPa to 3 MPa. Accordingly, compared to a case where the anisotropic conductive adhesive containing the resin particle or the like is used, it is possible to dramatically reduce the pressure applied to the circuit member. In addition, since the solder material (in particular, the bismuth-indium alloy) is melted, even when a high pressure is not applied to the circuit member, it is possible to easily ensure the electric connection as the electrode becomes wet by the solder material. Among these, since the solder material containing the bismuth-indium alloy of which a content of bismuth is from 27% by mass to 68% by mass is excellent in wettability with the electrode, the material is appropriate in a case where the second pressure is set to be a low pressure that is equal to or lower than 4 MPa.

A period of time during which the second pressure is applied is not particularly limited, but a case where the period of tune is from 0.5 seconds to 10 seconds, and further, from 1 second to 5 seconds, is desirable from the viewpoint of manufacturing costs. By finishing the applying of the second pressure during a short period of time, it is possible to more reliably suppress a thermal stress applied to the circuit member or a defect of the circuit member.

In the second pressing process, the heating temperature may be equal to or higher than the melting point of the solder material contained in the connection material, and is preferably a temperature that is equal to or higher than the melting point and equal to or lower than the melting point +10° C. For example, in a case where the melting point of the bismuth-indium alloy contained in the solder material is from 88° C. to 90° C., the heating temperature may be from 90° C. to 100° C. Specifically, the melting point of the solder material contained in the bismuth-indium alloy of which the content of bismuth is from 51% by mass to 55% by mass is from 85° C. to 89° C., and the heating temperature can be from 90° C. to 100° C. in the second pressing process.

In a case where the adhesive is the thermosetting resin, the heating temperature in the second pressing process is preferably higher than the temperature at which the hardening reaction of the thermosetting resin proceeds. Accordingly, in the second pressing process, it is possible to allow at least a part of the hardening of the thermosetting resin to proceed. Accordingly, it is possible to omit or shorten after-cure.

In addition, in a case where the adhesive contains the thermoplastic resin, the heating temperature in the second pressing process may be higher than the temperature at which the thermoplastic resin is melted.

Figure 1:
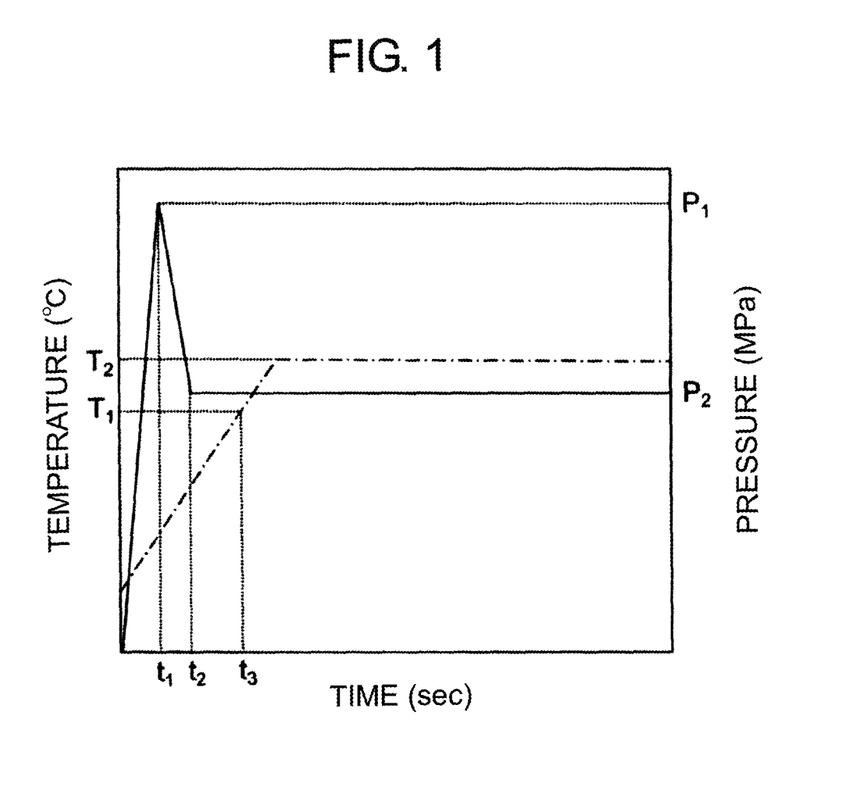
FIG. 1 is a schematic view illustrating an example of a temperature profile of a connection material and a pressure profile applied to a solder material in a thermocompression bonding process of a connecting method of a circuit member according to the disclosure.

Here, in FIG. 1, an example of a temperature profile of the connection material and a pressure profile applied to the solder material, in the third process (during thermocompression bonding), is illustrated. In FIG. 1, a solid line illustrates the pressure profile and a one dot chain line illustrates the temperature profile. Hereinafter, a case where the thermocompression bonding is performed by pressing the second circuit member toward the first circuit member by using the tool which can perform the pressing and the heating at the same time, will be described.

The first pressing process is started when the heated tool is pressed to the second circuit member, and from the moment, the temperature of the connection material is gradually raised by the heating. However, the period of time during which the pressure reaches the maximum pressure (first pressure $P_1$) at a time $t_1$ is shortened, and at the time $t_1$, the temperature of the connection material is sufficiently lower than a melting point $T_1$ of the solder material. At this time, since the adhesive rarely flows, between the first electrode and the second electrode, a large amount of the solder material solidified before being melted is captured, and the maximum first pressure $P_1$ is applied to the solidified solder material. After this, between the time $t_1$ to $t_2$, the pressure decreases from $P_1$ to $P_2$ (second pressure) (hereinafter, first pressing process). In addition, at the time $t_3$ after the pressure applied to the solder material becomes $P_2$, the temperature of the connection material reaches the melting point $T_1$ of the solder material. After this, the connection material is heated to a temperature $T_2$ higher than the melting point $T_1$ of the solder material (hereinafter, second pressing process). After the time $t_3$, the melted solder wet-spreads to the electrode, and when the heating is finished, the solder is solidified, and a solder portion having high connection reliability is formed.

Figure 2:
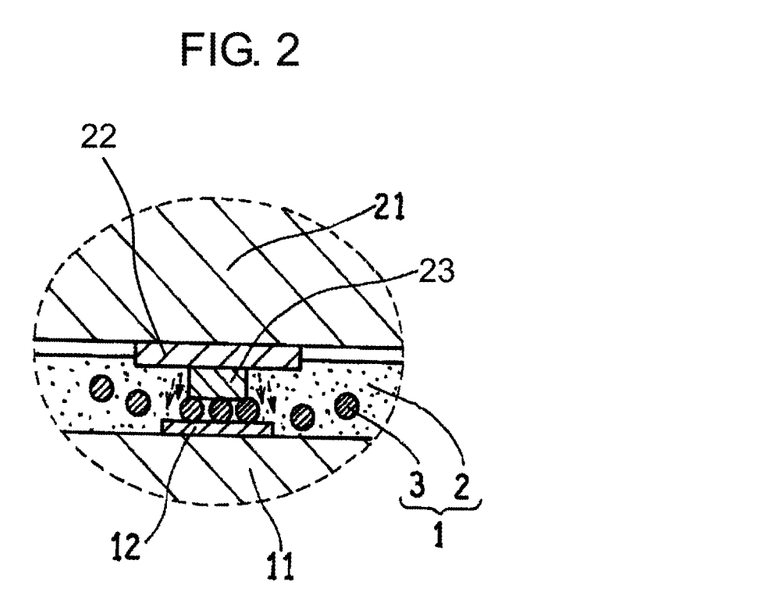
FIG. 2 is a schematic view of main portions illustrating an example of a state of the connection material in a first pressing process of the thermocompression bonding process according to the disclosure.

In FIG. 2, an example of a state of connection material 1 in the first pressing process is illustrated.

Connection material 1 contains adhesive 2 and solder material 3 which disperses in adhesive 2. The adhesive (resin composition) 2 when the maximum first pressure is applied rarely flows. Accordingly, solder particle 3 (an example of the solder material according to the disclosure) which exists between first electrode 12 of first circuit member 11 and bump 23 provided in second electrode 22 of second circuit member 21 can remain between first electrode 12 and bump 23 as it is. Accordingly, in a case where a connection area between first electrode 12 and bump 23 is small, solder particle 3 is also efficiently captured between first electrode 12 and bump 23.

In a case where the adhesive contains the thermosetting resin, in a case where the hardening reaction of the adhesive does not sufficiently proceed in the second pressing process, the after-cure may be performed.

By hardening the adhesive, a resin portion which adheres the first circuit member and the second circuit member is formed. For example, in a case where the first circuit member having the first main surface provided with the plurality of first electrodes that are arranged at a predetermined pitch, and the second circuit member having the second main surface provided with the plurality of second electrodes that are arranged at a predetermined pitch, are used, the resin portion may allow the first main surface and the second main surface to adhere to each other, and may be formed to cover at least a part of the solder portion. Accordingly, the solder portion is reinforced and the strength of a connection structure is improved. In addition, in a case where the pitch between the electrodes is narrow, the insulation between the adjacent electrodes is also likely to be ensured.

The connecting method of a circuit member according to the disclosure is efficient as an alternative technology of a technology that uses the anisotropic conductive adhesive containing the resin particle or the like, and is particularly efficient in a case of forming the connection structure containing a circuit member having a small electrode, and in a case of manufacturing small liquid crystal provided in a tablet or a smartphone.

What is claimed is:

1. A connecting method of a circuit member, comprising:
a first process of preparing a connection material containing an adhesive and a solder material that disperses in the adhesive:
a second process of preparing a first circuit member having a first electrode and a second circuit member having a second electrode, and disposing the first circuit member and the second circuit member to cause the first electrode and the second electrode to oppose each other via the connection material; and
a third process of compressing the first circuit member and the second circuit member while applying heat to the connection material,
wherein the third process includes a first pressing process, wherein the solder material is pressed by a first pressure of 15 MPa to 30 MPa before the adhesive starts to flow by the heat,
wherein the first pressing process further includes a process wherein a pressure applied to the solder material is decreased from the first pressure to a second pressure that is equal to or lower than 40% of the first pressure, before the solder material melts, and
the third process further includes a second pressing process after the first pressing process, wherein, in the second pressing process, the solder material is pressed at the second pressure, while being heated at a temperature equal to or higher than a melting temperature of the solder material.

2. The connecting method of a circuit member according to claim 1,
wherein the adhesive includes a thermosetting resin, and
wherein a temperature at which hardening reaction of the thermosetting resin proceeds is higher than the melting point of the solder material.

3. The connecting method of a circuit member according to claim 1,
wherein a bump is provided in at least one of the first electrode and the second electrode, and wherein Vickers hardness of the bump is greater than Vickers hardness of the solder material.

4. The connecting method of a circuit member according to claim 3,
wherein the Vickers hardness of the bump is equal to or greater than 20 Hv, and
wherein the Vickers hardness of the solder material is less than 20 Hv.

5. The connecting method of a circuit member according to claim 3,
wherein the bump includes gold at least in a surface.

6. The connecting method of a circuit member according to claim 1,
wherein the solder material contains a bismuth-indium alloy.

7. The connecting method of a circuit member according to claim 6,
wherein an amount of bismuth contained in the bismuth-indium alloy is from 27% by mass to 88% by mass.

8. The connecting method of a circuit member according to claim 6,
wherein an amount of bismuth contained in the bismuth-indium alloy is from 51% by mass to 55% by mass.

* * * * *